United States Patent [19]

Donat

[11] Patent Number: 5,079,511
[45] Date of Patent: Jan. 7, 1992

[54] CIRCUIT ARRANGEMENT WITH A TRANSMITTER SYSTEM FOR PATH OR ANGLE DEPENDENT SIGNALS

[75] Inventor: Albrecht Donat, Erlangen, Fed. Rep. of Germany

[73] Assignee: Siemens Aktiengesellschaft, Berlin and Munich, Fed. Rep. of Germany

[21] Appl. No.: 501,164

[22] Filed: Mar. 29, 1990

[30] Foreign Application Priority Data

Mar. 30, 1989 [EP] European Pat. Off. ......... 89105645.9

[51] Int. Cl.$^5$ ............................ H03K 5/00; H03K 5/01
[52] U.S. Cl. .............................. 328/161; 328/5; 328/133; 328/181; 307/261; 307/514
[58] Field of Search .............. 307/262, 261, 511, 514, 307/515; 328/15, 161, 133, 181

[56] References Cited

U.S. PATENT DOCUMENTS

| | | | |
|---|---|---|---|
| 3,398,372 | 8/1968 | Wu et al. | 328/28 |
| 3,675,238 | 7/1972 | Butscher | 328/116 |
| 3,859,603 | 1/1975 | Herzner | 328/181 |
| 4,176,398 | 11/1979 | Rider | 328/181 |
| 4,422,044 | 12/1983 | Mueller | 328/181 |
| 4,841,251 | 6/1989 | Hartmann et al. | 328/181 |
| 4,956,566 | 9/1990 | Rupp | 307/261 |

FOREIGN PATENT DOCUMENTS

| | | |
|---|---|---|
| 0325981 | 8/1989 | European Pat. Off. . |
| 3126047 | 6/1982 | Fed. Rep. of Germany . |
| 3218101 | 11/1983 | Fed. Rep. of Germany . |
| 3802549 | 1/1988 | Fed. Rep. of Germany . |
| 2234550 | 1/1975 | France . |

OTHER PUBLICATIONS

Patent Abstracts of Japan 57/059,116, 9/4/82.
2301 N.T.I.S. Technical Notes, No. 11, Part B, 11/84.

Primary Examiner—John S. Heyman
Assistant Examiner—Terry D. Cunningham
Attorney, Agent, or Firm—Kenyon & Kenyon

[57] ABSTRACT

A linear, path or angle dependent signal sequence (E) is formed from two path or angle dependent signals (A, B) of equal amplitude and period having an electrical phase offset to each other of 90° and being generated by an incremental transmitter (GS), in that the transmitter signals (A,B) are rectified and an output signal is formed in a converter (U1), which [output signal] corresponds to the quotient of the respectively smaller absolute value (|A| or |B|) of the signals (A or B) to the sum (|A|+|B|) of the absolute values (|A|, |B|) of both signals (A, B). The respective, precise position is detected from this signal sequence by means of a digital convervison.

9 Claims, 1 Drawing Sheet

CIRCUIT ARRANGEMENT WITH A TRANSMITTER SYSTEM FOR PATH OR ANGLE DEPENDENT SIGNALS

BACKGROUND OF THE INVENTION

The present invention refers to a circuit arrangement with a transmitter system which supplies two path- or angle-dependent, sine-shaped signals of equal amplitude and cycle, which signals are offset in electrical phase by approximately 90°, whereby a digitizable signal sequence, which is linearly-dependent on the path or angle, is formed from these two signals by means of a rectification.

In particular, digital increment transmitters with roughly sine-shaped output signals which have a 90° electrical phase offset are customary for detecting rotary movements of machine parts. If these transmitter signals are to be evaluated, then the requisite signal processing can be facilitated in that a linear correlation is achieved between the path or angle and a signal sequence is derived from the transmitter signals. A circuit arrangement for this purpose is known from DE-PS 32 18 101. In this circuit arrangement, a roughly triangular signal, whose amplitude has a linear correlation to the position within each one-eighth cycle of the transmitter, is generated from the transmitter signals through rectification and the formation of a minimum value. The subdivision of the transmitter cycle is facilitated by the analog-digital conversion and the linkage with comparator signals which select the appropriate one-eighth cycles. However, in the case of this device, there is a certain sensitivity to errors in the transmitter signals; i.e. to errors in amplitude equality, phase- and offset errors.

In the German patent application P 38 02 549, a circuit arrangement is described which also operates with two path or angle dependent, sine-shaped signals of the same amplitude and cycle, which are offset in electrical phase by 90°; whereby, however, there is a relatively large insensitivity to the aforesaid distortions of the transmitter signals. In this circuit arrangement, however, the resolution is limited to two triangular waveforms, i.e. four linear sectors within a cycle.

SUMMARY OF THE INVENTION

An object of the present invention is to provide a circuit arrangement of the aforesaid type in which there is a linear correlation between the path or angle and a signal sequence which is derived from the transmitter signals with little technical complexity. In this circuit arrangement, a greatest possible tolerance range shall be permissible for the transmitter signals on the one hand, and on the other, a highest possible resolution of the linear signals shall be reached.

The above and other objects of the invention are achieved by a circuit arrangement with a transmitter system which supplies two path- or angle- dependent, sine-shaped signals of equal amplitude and period, the signals being offset in electrical phase by 90°, whereby a digitizable signal sequence which is linear-dependent on the path or angle is formed from these two signals through resolution, comprising a converter forming an output signal proportional to the quotient of the respective smaller absolute value of one of the signals to the sum of the absolute values of both signals, said output signal adapted to be supplied as a signal sequence to additional evaluation units.

A first advantageous development of the invention is characterized in that residual non-linearities of the resulting signal sequence can be reduced by means of a signal conversion corresponding to a characteristic curve which is adjusted for the non-linearity. In this manner, the inherently already very small measuring errors caused by the system can again be reduced corresponding to the requirements. The characteristic curve can be produced in a simple manner, technically speaking, by means of a buckled characteristic curve. In this context, it has proved advantageous that the signal conversion take place upstream of the converter forming the quotients. A signal conversion, which can be technically accomplished in a relatively simple manner, is thus made possible in the analog region.

A further development of the invention is characterized in that an evaluation circuit is provided by means of which the respective relevant partial cycle can be defined according to the polarity of the signals of the transmitter system. Thus, an unequivocal determination of position within one respective cycle is guaranteed.

Given that the resulting triangular signal sequence is convertible into a saw-tooth shaped signal sequence by means of reflecting the respective up and downward moving signal progression, an extremely simple further signal analysis follows since the signal patterns in the subsequent one-eighth cycles are then of the same shape.

BRIEF DESCRIPTION OF THE DRAWINGS

The invention will be described in greater detail in the following detailed description with reference to the drawings, in which.

DETAILED DESCRIPTION

Figure 1:
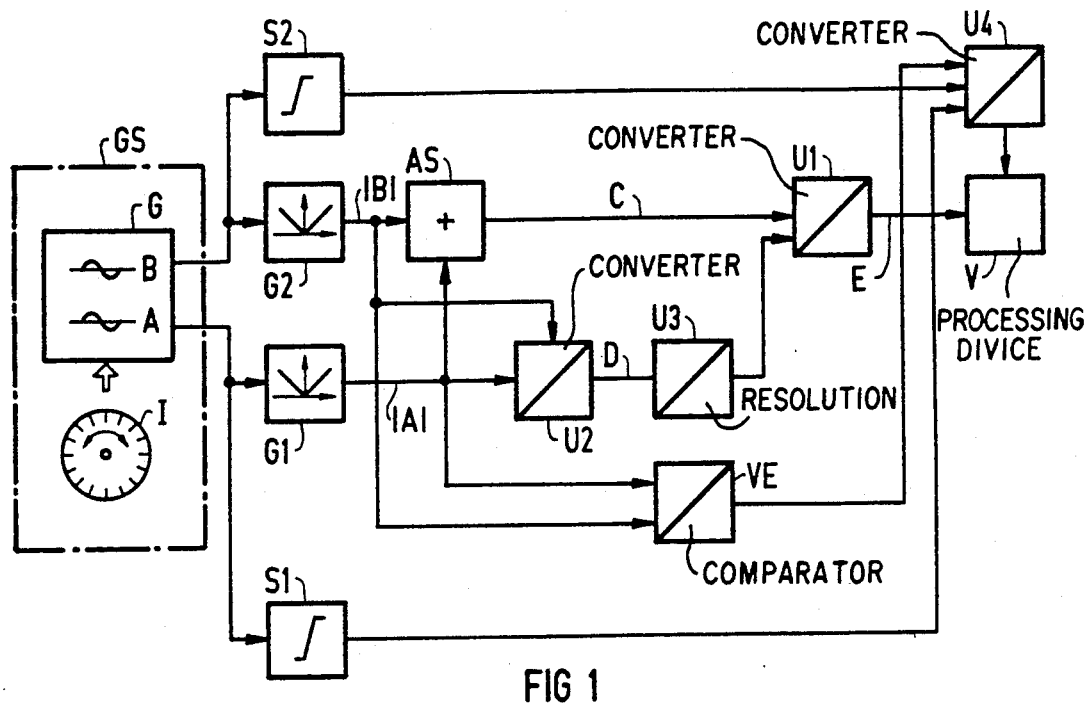
FIG. 1 shows a block diagram of the invention.

In the representation according to FIG. 1, a transmitter system GS for picking up rotary motions is shown in which a pulsing wafer disc I is moved mechanically according to the rotary motion to be detected; and whereby, according to the sequence of the pulse marks of the pulsing wafer disc I, a transmitter G supplies two angle-dependent, sine-shaped signals of equal amplitude and cycle through two pick-up heads—which are not represented for the sake of clarity—which signals offset each other in electrical phase by 90°. The signals of the transmitter G are thereby marked A and B.

The signal A is rectified with the aid of a rectifier G1, on whose output a signal $|A|$ is available which accordingly corresponds to the absolute value of the signal A, respectively. The signal B is supplied to a rectifier G2, which also converts the signal B into an output signal $|B|$ which corresponds to the absolute value of the signal B. The signals $|A|$ and $|B|$ are sent to a summing level AS which forms an output signal referred to as signal C in the following, which corresponds to the sum $|A|+|B|$ of the absolute values $|A|$ and $|B|$ of the signals A and B. This signal C arrives at the first input of a converter U1.

Furthermore, the signals $|A|$ and $|B|$ arrive at the input of a converter U2 which respectively switches through to its output the smaller of the two signals $|A|$ and $|B|$ as signal D. This signal D is conducted to the second input of the converter U1 over a converter U3, whose function will be covered in detail in the following. An output signal E is formed by the converter U1 in digital form, which results in:

$$E = 2 \cdot (\text{Min}(|A|, |B|)/(|A|+|B|)) \cdot \text{resolution}.$$

The resolution thereby corresponds to the maximum output value, e.g. $2^8$, of the converter U1. The signal E would in this case have a width of 8 bits.

Figure 2:
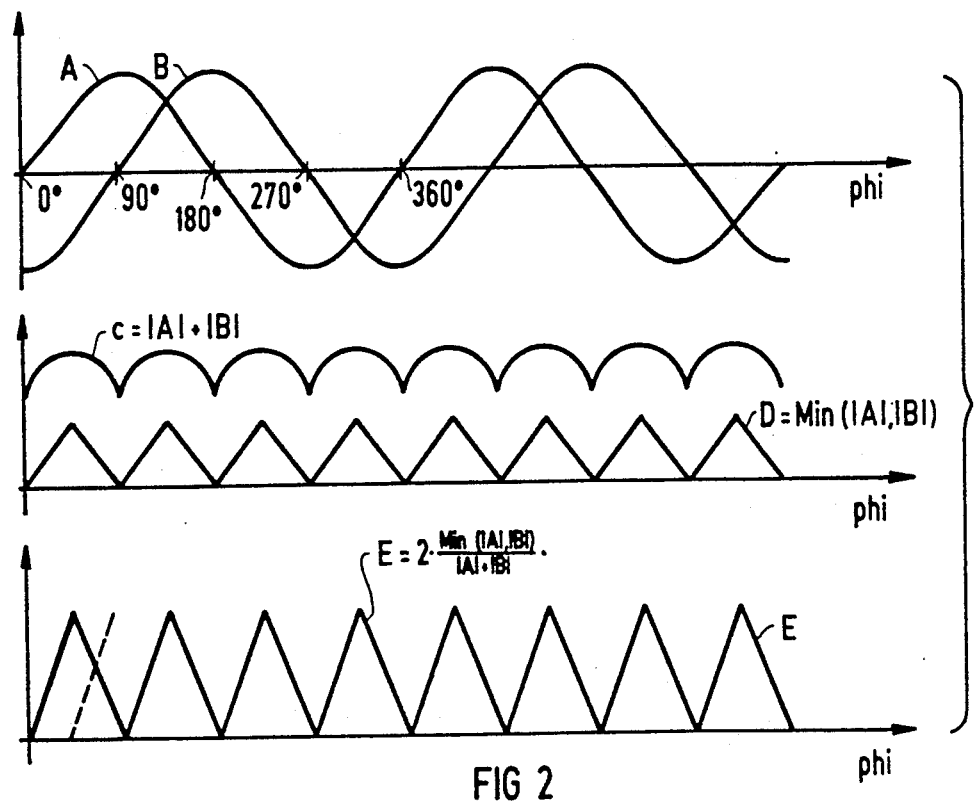
FIG. 2 shows significant signal patterns in the block diagram of FIG. 1.

The signals A and B of the transmitter G, which signals depend on the rotary motion of the pulsing wafer disc I, are represented in the top diagram of FIG. 2. In the case of a given clockwise rotary motion, the signal B, which has a same amplitude and same cycle as the signal A, thereby follows this motion with an electrical delay of 90°. In the top diagram, moreover, the boundaries of the significant quarter cycles, i.e., the values of the angle phi of 0°, 90°, 180°, 270° and 360°, are marked.

In the center diagram of FIG. 2, the sum signal of the absolute values of the signal A and B, i.e. signal $C = |A| + |B|$ is represented on the same scale as in the top diagram. Furthermore, the progression pattern of the signal $D = \text{Min}(|A|, |B|)$ is shown in the center diagram. This triangular signal D is shown in an idealized manner, since it is assumed that the amplitude of this signal [D] varies with fluctuations of the signals A and B.

In the bottom diagram of FIG. 2 it is shown that the signal E produces a triangular progression pattern which is shown by a traversing line. This type of a signal is generated in a finely digitized manner by the converter U1 as described above according to FIG. 1. In this manner a linear correlation exists between the angle phi of the pulsing wafer disc I to be detected and the signal E which is detected by the converter U1. So that an angle value, which indicates the respective position within the respective triangular progression pattern, can be assigned to each amplitude of this signal sequence in the simplest possible manner, each downward moving signal progression of the triangular signal sequence can be reflected by means of a converter circuit, which is not represented for the sake of clarity, as is shown by a dotted line for the first triangular progression pattern in the bottom representation according to FIG. 2.

For detecting which quarter cycle is relevant at any given moment, it can be detected with the aid of threshold value levels S1 and S2 and a converter U4 that when the signal A has a positive polarity and the signal B a negative polarity, 12 this indicates an angular range of 0° to 90°; when both signals have a positive polarity, this indicates an angular range of 90° to 180°. When the signal B has a positive polarity and the signal A has a negative polarity, this indicates an angular range of 180° to 270°; and when both signals have a negative polarity, then this indicates an angular range between 270° and 360°. This information can be supplied to a processing unit V by the converter U4, to which processing unit V the output signal E of the converter U1 is also supplied. Moreover, in order to be able to make a statement about which one-eighth cycle is at hand, a comparator unit VE is provided to which the signals $|A|$ and $|B|$ are supplied. In the comparator unit VE, then, a corresponding first output signal is always generated whenever $|A| > |B|$, or a second output signal is generated whenever $|A| < |B|$. Both output signals are supplied to the converter U4, which holds ready a corresponding one-eighth cycle signal for the processing unit V by means of a logical linking with the signals of the threshold value levels S1 and S2.

In the representation according to FIG. 2, the signal sequence is formed as an ideal triangular- or saw-tooth operation in the bottom diagram. Strictly speaking, however, small non-linearities still are present. The error caused by this is in many cases negligible; however, it is also possible to undertake a widespread resolution in a relatively simple manner by adjusting the transfer characteristic curve of the converter U3. A direct resolution of the signal E would also be conceivable; however, these signals would have to move within the digital region, which is technically more difficult to accomplish than the resolution within the analog region.

Insofar as transmitter signal errors appear—i.e. errors in amplitude equality, phase- and offset errors—worse measuring errors than in the ideal case do indeed result; however, it has been shown an important advantage that the output code remains intact in each case; i.e., the progression pattern of the signal E always follows from 0 to a value corresponding to the resolution. In this way, the curves remain mnnotonous. Merely a linear distortion could be characterized as a consequence of the transmitter error, which distortion, however, would remain within very narrow tolerances with this quality of commercial transmitters.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A circuit arrangement coupled to a generator system supplying two path- or angle-dependent sinusoidal signals shifted with respect to phase by 90 degrees, comprising first and second rectifiers, the first signal being supplied to the first rectifier and the second signal being supplied to the second rectifier, a summation circuit, output signals of the first and second rectifiers being coupled to inputs of the summation circuit, and a first converter receiving an output signal of the summation circuit and an output signal of a second converter, said second converter having inputs coupled to the outputs of the first and second rectifiers and allows the respective smaller input signal to pass to the output of the second converter, said first converter providing an output signal corresponding to a quotient of the output signal of the second converter and the output signal of the summation circuit, said output signal of the first converter having a magnitude substantially proportional to the respective path or angle during half a quarter period of the sinusoidal signals.

2. The circuit arrangement recited in claim 1, further comprising means connected between the second and first converter, for reducing a remaining non-linearity of the first converter through a signal conversion in accordance with a characteristic of the remaining non-linearity.

3. The circuit arrangement recited in claim 1, further comprising an evaluation circuit for determining the relevant quarter period according to the polarity of the first and second signals of the generator system, said evaluation circuit being coupled to an output of said first converter.

4. An apparatus for forming a linear signal with a magnitude substantially proportional to a path during a quarter period of a first path-dependent sinusoidal signal and a second path-dependent sinusoidal signal, which are shifted with respect to phase from each other by 90 degrees, wherein the apparatus is coupled to a generator system supplying the first and second path-dependent sinusoidal signals, said apparatus comprising:
   (a) a first rectifier having an output and receiving the first path-dependent sinusoidal signal;
   (b) a second rectifier having an output and receiving the second path dependent sinusoidal signal;
   (c) a summation circuit having inputs coupled to the outputs of the first and second rectifiers, and outputting a summation signal which is a sum of the outputs of the first and second rectifiers;
   (d) a first converter having inputs coupled to the outputs of the first and second rectifiers, and outputting a smaller signal which is a smaller of the outputs of the first and second rectifiers; and
   (e) a second converter receiving the summation signal and the smaller signal as inputs, and forming a quotient of the smaller signal and the summation signal, providing an output corresponding to said quotient as the linear signal.

5. The apparatus according to claim 4, further comprising means connected between the second and first converter, for reducing a remaining non-linearity of the linear signal through a signal conversion in accordance with a curve of the remaining non-linearity.

6. The apparatus according to claim 4, further comprising an evaluation circuit determining a relevant quarter period according to a polarity of the first and second path-dependent sinusoidal signals, said evaluation circuit being coupled to the output of said second converter.

7. An apparatus for forming a linear signal with a magnitude substantially proportional to an angle during a quarter period of a first angle-dependent sinusoidal signal and second angle-dependent sinusoidal signal, which are shifted with respect to phase from each other by 90 degrees, wherein the apparatus is coupled to a generator system supplying the first and second angle-dependent sinusoidal signals, said apparatus comprising:
   (a) a first rectifier having an output and receiving the first angle-dependent sinusoidal signal;
   (b) a second rectifier having an output and receiving the second angle-dependent sinusoidal signal;
   (c) a summation circuit having inputs coupled to the outputs of the first and second rectifiers, and outputting in summation signal which is a sum of the outputs of the first and second rectifiers;
   (d) a first converter having inputs coupled to the outputs of the first and second rectifiers, and outputting a smaller signal which is a smaller of the outputs of the first and second rectifiers; and
   (e) a second converter receiving the summation signal and the smaller signal as inputs, and having as output corresponding to the quotient of the smaller signal and the summation signal, whereby said output provides the linear signal.

8. The apparatus according to claim 7, further comprising means connected between the second and first converter, for reducing a remaining non-linearity of the linear signal through a signal conversion in accordance with a curve of the remaining non-linearity.

9. The apparatus according to claim 7, further comprising an evaluation circuit determining a relevant quarter period according to a polarity of the first and second angle-dependent sinusoidal signals, said evaluation circuit being coupled to the output of said second converter.

* * * * *